United States Patent [19]

Shimazu et al.

[11] 4,347,300

[45] Aug. 31, 1982

[54] IMAGING PEEL APART ELEMENT EMPLOYING TWO PHOTOHARDENABLE LAYERS

[75] Inventors: Ken-Ichi Shimazu, Pleasantville; Takao Nakayama, Yonkers, both of N.Y.

[73] Assignee: Polychrome Corporation, Yonkers, N.Y.

[21] Appl. No.: 904,840

[22] Filed: May 11, 1978

Related U.S. Application Data

[63] Continuation-in-part of Ser. No. 802,851, Jun. 2, 1977, abandoned.

[51] Int. Cl.³ .............................. G03C 1/54; G03C 1/78
[52] U.S. Cl. ..................................... 430/156; 430/141; 430/145; 430/157; 430/160; 430/162; 430/166; 430/167; 430/176; 430/189; 430/194; 430/253; 430/270; 430/273; 430/281; 430/292; 430/308; 430/311; 430/312; 430/325; 430/326
[58] Field of Search ............... 96/68, 75, 91 R, 91 N, 96/91 D, 115 R, 83, 28, 35, 35.1, 49; 430/141, 145, 157, 160, 162, 166, 167, 176, 189, 194, 253, 270, 273, 281, 292, 308, 311, 312, 325, 32 C, 254

[56] References Cited

U.S. PATENT DOCUMENTS

| | | |
|---|---|---|
| 2,409,564 | 10/1946 | Heinecke et al. ................ 96/83 |
| 3,136,637 | 6/1964 | Larson .......................... 96/33 |
| 3,353,955 | 11/1967 | Colgrove ...................... 96/28 |
| 3,649,283 | 3/1972 | Christensen et al. ............ 96/83 |
| 3,671,236 | 6/1972 | Van Beusekom ............... 96/83 |
| 3,721,557 | 3/1973 | Inoue .......................... 96/28 |
| 3,770,438 | 11/1973 | Celeste ........................ 96/28 |
| 3,905,815 | 9/1975 | Bonhan ....................... 96/35.1 |
| 4,050,936 | 9/1977 | Takeda et al. ................. 96/28 |
| 4,205,989 | 6/1980 | Moriya et al. ................ 430/253 |
| 4,284,703 | 8/1981 | Inoue et al. .................. 430/254 |

FOREIGN PATENT DOCUMENTS 986773 4/1976 Canada ............................ 430/253

OTHER PUBLICATIONS

Chemical Abstracts, vol. 77, Abstract #95357y, 1972, (Landau et al.).
Chemical Abstracts, vol. 87, Abstract #192126m, 1977, (Inoue et al.).
Chemical Abstracts, vol. 88, Abstract #30394r, 1978, (Moriya et al.).

*Primary Examiner*—Charles L. Bowers, Jr.

[57] ABSTRACT

This invention relates to novel photosensitized sheet constructions which, upon exposure to an energy source through a screened image, can accurately and simultaneously reproduce said image in both its negative and positive forms.

6 Claims, 8 Drawing Figures

IMAGING PEEL APART ELEMENT EMPLOYING TWO PHOTOHARDENABLE LAYERS

CROSS REFERENCE TO RELATED APPLICATION

This application is a continuation in part of co-pending U.S. patent application Ser. No. 802,851 filed June 2, 1977 now abandoned.

BACKGROUND OF THE INVENTION

This invention relates to novel photosensitive sheet construction which, when exposed to a suitable light energy source through a screened image, will yield simultaneously both a negative and positive reproduction of said screened image.

The novel photosensitive sheet construction of this invention are particularly useful in the graphic arts field. For example, in the lithographic printing arts, it is frequently necessary or desirable to convert a negative film image to a positive one for further use in the preparation of lithographic printing plates. Heretofore, this conversion from a negative to positive image, and vice versa, has been time consuming, expensive and inefficient. We have now discovered a novel imaging system and product which can directly, efficiently and inexpensively be employed to convert a negative image to a positive one, and vice versa.

The novel imaging system and products of this invention comprise a layered or sandwich type sheet construction, which in one embodiment is comprised of the following elements:

1. A top sheet;
2. A light sensitive gas generating diazonium layer applied to and contacting at least one surface of said top sheet;
3. An imaging layer which is applied to and in contact with the surface of said diazo layer;
4. An adhesive layer which is in contact with the surface of said imaging layer; and
5. A base sheet layer supporting said adhesive layer and bound thereby to said other layers.

Said image layer and/or said adhesive layer comprise light sensitive photohardenable or photocrosslinkable materials.

In another embodiment said adhesive layer and said imaging layer may be combined to form a single stratum and in still other embodiments the base sheet layer may be completely eliminated from both of the previously mentioned constructions. These arrangements will be more completely described hereinafter.

To date, it has been a problem in the art to provide an imaging system which would allow the quick, easy and dependable availability of an image reproduction, in both its positive and negative forms, having a quality suitable for use in the graphic arts and other image reproducing applications. As part of the present invention it has been found that by forming a specific layered construction and exposing it through a transparent mask to an U.V. light energy source, the layers may be immediately separated whereby a positive reproduction of the mask image is apparent on one leaf of the separated construction and a negative of said image appears on the other leaf. Furthermore, these images are visible immediately upon exposure and are available after separation for a series of other uses without any further developing treatment. This is an important point of novelty since other prior art systems require some post treatment, such as image curing or development, before a useful product can be attained. One such prior art method requires development by heat treatment, another requires solvent development. Importantly, the present disclosure requires no chemical or other processing subsequent to exposure as is required by such other prior art methods.

Applications for which this dry transfer system is useful include, direct transferability of the image to other surfaces, manufacture of color proofing guides, art composition, engineering drawings, letter and figure transfers, photocomposition, photoresists, nameplates, presensitized printing plates, and bimetal printing plates.

Advantages over the prior art include, the elimination of chemical processing or other treatment to attain the image after exposing; availability of a colored image without subsequent treatments; finer image resolution and a higher degree of energy response since the imaging layer which may be colored is not blended with the energy sensitive layer whereby the functions interfere with one another; no fixing is required; the image is instantly visible upn exposure and may be evaluated for quality without further processing, allowing a continued or multiple exposure if necessary or desirable. Other advantages include safe room light handling; no pollution or exposure of workers to caustic chemicals; and transferable and erasable images in both the positive and negative forms. Importantly, there need not be any alteration of exposures when different colored constructions are selected since the image layer has no effect on the sensitivity of the energy sensitive agent. In systems where both the energy sensitive agent and the imaging agent are blended into one layer the imaging layer absorbs a quantity of the supplied exposure energy and, depending on the amount absorbed by different colorants, the exposure must be adjusted by some factor when changing from one color to another. This adjustment is not required with the instant system.

DESCRIPTION OF THE PRIOR ART

It is known in the prior art that photosensitive diazo compounds liberate nitrogen gas upon photodecomposition. Specifically, British Pat. No. 712,966 describes one method of preparing a print material whereby a diazo and resin composition is coated on a base; however this disclosure requires development by subjecting an image to elevated temperatures after exposure to actinic light through a mask.

Japanese patent S38-9663 demonstrates one type of peel apart system whereby a photosensitive composition is situated between a base and a film sheet whereby the photosensitive composition has a stronger bonding force exerted on the film than on the base before exposure and a stronger bonding force on the base then on the film after imagewise exposure. This system has proved to be substantially unworkable since such subtle reversals in adhesive properties are difficult to achieve with consistent results. Still another method, as developed by the Fuji Photo Film Company employs two light sensitive layers containing photopolymers which have different adhesive attractions for a base and a covering film sheet. This has been described in West German Pat. No. 2,558,530.

U.S. Pat. Nos. 3,060,024 and 3,060,025 show another system whereby high polymers are imagewise formed. Upon exposure certain areas are rendered tacky, particles are dusted to tacky areas, a transfer sheet is applied to the substrate and heated and the films then separated. It must be noted that no visible image exists immediately prior to particle dusting. In the instant invention there is no required application of dusted particles subsequent to exposure and no surface heating thereafter.

U.S. Pat. No. 2,760,863 describes another system whereby insoluble high polymers are formed by photopolymerization and non-image areas are removed by washing with a solvent after exposure.

U.S. Pat. No. 3,136,637 provides still another imaging system, which also requires solvent development.

The instant invention is distinctly different from each cited reference. The present invention discloses an article with separate photosensitive and image forming layers. After exposure by well known methods, a visible image is instantly apparent. No further processing or development by heat or ultraviolet treatment or solvents is required. Also, there is no reversal of adhesive attraction by the photosensitive layer either from the top cover to the base sheet or vice versa when viewed both before and after imagewise exposure. The differential mechanism which is a main feature of novelty is a delamination of the layers after exposure. That is, the energy sensitive layer, which before exposure adhered to its adjacent layers has now decomposed at the exposed areas with a concurrent emission of gas which exerts an outward pressure and separation from its corresponding adjacent layers at these exposed areas. No element of the prior art demonstrates this phenomenon.

SUMMARY OF THE INVENTION

The present invention provides a multi-layered light sensitive image forming construction which is capable, upon imagewise exposure, of providing both positive and negative reproductions of an image by means of a delamination process.

The construction comprises a transparent top layer, a photosensitive gas generating diazo layer, an image forming layer which may possess adhesive properties, an optional adhesive layer and an optional base support.

Importantly, either the top layer or support base must be substantially transparent in order to permit radiant energy, in the form of light, to penetrate therethrough and reach the photosensitive layers beneath it. The top layer must also be substantially gas impermeable. The diazo layer must be capable of decomposing with the concurrent generation of a gas, such as nitrogen. The image layer typically comprises a resinous material which may have additives such as colorants, adhesives, photohardeners or photocrosslinkers blended with it. The optional adhesive layer is employed to aid in the separation of the positive and negative images and also may contain photohardeners or photocrosslinkers. The optional base support provides a foundation for the system of layers. This base is optional since it is possible for a construction to be formed by use of only the other layers which is then applied over some proprietary base support prior to irradiation.

The hardening of the image and/or adhesive layers provides improved resolution, chemical resistance and scratch resistance over embodiments where these layers are not so constructed.

Upon imagewise exposure of the construction through a mask, the radiant energy is selectively transmitted through the transparent top layer and causes activation of the diazo layer whereby nitrogen gas is released, as a result of the decomposition of the energy sensitive material. A gas bubble is then formed between the top layer and the image layer where the diazo layer was exposed. This breaks any adhesive bonds which may have existed between the diazo layer and the top layer or the image layer. Not only is there now no adhesion between these layers but the gas pressure from the bubble acts to press these layers apart forcefully. Upon reviewing the construction from its top, the image imparted to it is clearly visible by means of these bubble gas pockets. By separating both the top and base layers, the adhesive forces exerted between the layers are such that the image layer is selectively adherent to both the top and bottom layers such that a positive reproduction of the original image is apparent upon the top layer and a negative reproduction of the image is apparent upon the bottom layer. Importantly, the binding force between the layers to be separated must be the weakest bond of any other interface of the construction. Both positive and negative images are now available for use in any of a variety of ways as hereinbefore discussed.

It is, therefore, an object of the present invention to provide a multilayered image forming construction which is capable of providing image reproduction in both its positive and negative form.

It is another object of the present invention to provide a multilayered image forming construction which does not require additional treatment or development after exposure.

It is still another object of the present invention to provide a multilayered image forming construction which has an image forming layer substantially free of mixture with the diazo material and a diazo layer substantially free of image forming material.

It is a further object of the present invention to provide a multi-layered image forming construction which manifests a visible image immediately after exposure to a U.V. energy source by means of a delamination process as a result of gas emission from decomposition of an energy sensitive material.

These and other objects of the invention will be in part discussed and in part apparent upon consideration of the detailed description of the preferred embodiment as provided hereinafter.

DETAILED DESCRIPTION OF THE PREFERRED EMBODIMENT

Figure 1:
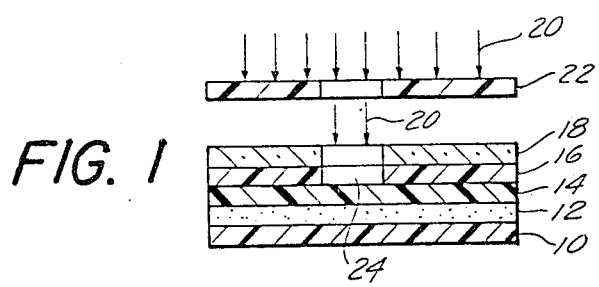
FIG. 1 is a cross section of a five layered construction being imagewise exposed to a UV energy source through a transparent mask.

Referring now to the drawings, FIG. 1 shows a five layered construction produced according to the method of the present invention. It is shown to comprise a base support 10, an adhesive layer 12 in intimate contact with said base support, an image forming layer 14 in contact with said adhesive layer and a diazo containing layer 16 which is capped with a top layer 18. When the construction is exposed to radiant energy 20 through a mask 22, said radiant energy 22 passes through said top layer which is transparent and reacts with the diazo layer at section 24.

Figure 8:
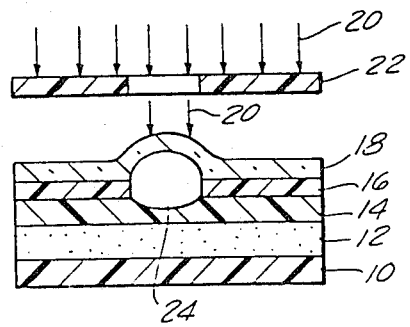
FIG. 8 is a cross section of a five layered construction similar to FIG. 1, after imagewise exposure but before peel apart, showing the bubble formation where the diazo material was exposed with the concomitant discharge of gas.

FIG. 8 is demonstrative of the operative mechanism of the invention. The construction is shown to form a gas bubble at 24 where the diazo composition has been exposed but none where is has not been exposed. This gas is released as the product of the decomposition of said diazo material at the exposed portion 24. This bubble exerts an outward pressure upon the top surface layer 18 which appears as a visible image.

Figure 2:
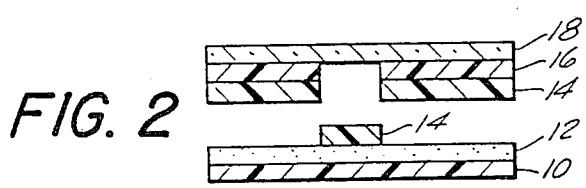
FIG. 2 is a cross section of a five layered construction after peel apart wherein the adhesive employed has a greater bonding strength to the base than to the image layer.
Figure 3:
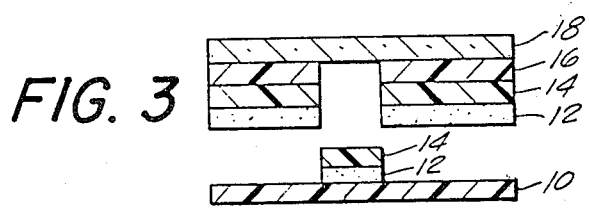
FIG. 3 is a cross section of a five layered construction after peel apart wherein the adhesive employed has a greater bonding strength to the image layer than to the base.

FIGS. 2 and 3 demonstrate the end product after the top and bottom layers have been peeled apart. The difference noted demonstrates alternate results which depends upon the binding characteristics of the adhesive layer. If the adhesive clings more forcefully to the base than to the imaging layer, then the configuration of FIG. 2 is attained. If however, the adhesive binds more forcefully to the imaging layer than the base, then the product of FIG. 3 is attained. Note that in either case a positive image is reproduced on the top leaf and a negative image is reproduced on the botttom leaf.

Figure 4:
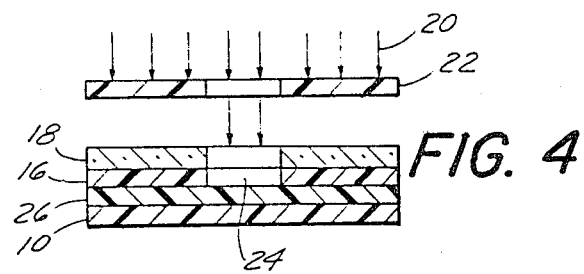
FIG. 4 is a cross section of a four layered construction being exposed imagewise to a UV energy source through a transparent mask wherein the imaging and adhesive compositions are combined in one and the same layer. Note that this image-adhesive composition must always have a greater bonding strength to the image than to the base for operation.
Figure 5:
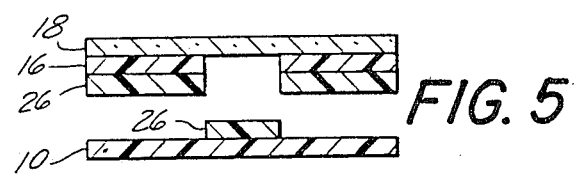
FIG. 5 is a cross section of a four layered construction of FIG. 4 after peel apart.

FIG. 4 shows a multilayered aggregation whereby both the imaging and adhesive functions are combined within a single, integrated layer 26. The exposure mechanism is exactly the same as demonstrated in FIG. 8, however, upon being peeled apart, the embodiment of FIG. 5 is attained. In short, element 26 is a blend of elements 12 and 14 into a single stratum.

Figure 6:
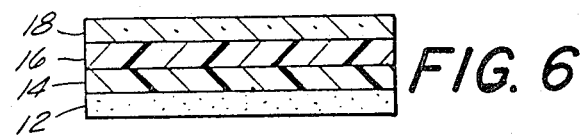
FIG. 6 is a cross section of a four layered construction similar to FIG. 1 except the bottom support layer is not a part of this embodiment.
Figure 7:
FIG. 7 is a cross section of a three layered construction similar to FIG. 4 except the bottom support layer is not a part of this embodiment.

FIGS. 6 and 7 demonstrate two variant embodiments on the products represented by FIGS. 1 and 4 in that no base support is provided. These are useful when a specialized or proprietary base is sought to bear the image. In effect, these constructions are first applied to said proprietary base to form articles similar to FIGS. 1 and 4 respectively and then are processed in the usual manner of this invention.

In accordance with the present invention it has been found that the base layer, when one is employed may be comprised of any solid sheet material having a substantially regular surface. These include, but are not limited to the following compositions and combinations thereof: glass, metals, for example, aluminum sheets, paper, silicon, and films or sheets comprised of:
Acrylonitrile-butadiene-styrene terpolymers (ABS)
Cellulose Acetate
Cellulose triacetate
Cellulose acetate butyrate
Cellulose propionate
Polybutylene
Polybutadiene
Polycarbonate
Polyester
Polyethersulfone
Polyethylene (Low, medium and high density)
Ethylene-propylene copolymers
Ethylene vinyl acetate copolymers
Nylons (polyamides)
Acrylonitrile copolymers
Ionomers
Polyimides
Polymethylmethacrylates
Polychlorotrifuloroethylenes
Fluoronated ethylene propylene copolymers
Perfluoroalkoxy resins
Ethylene-chlorotrifluoroethylene copolymers
Ethylene-tetrafluoroethylene copolymers
Polyvinyl fluoride resins
Polyvinylidne fluoride resins
Polypropylenes
Polystyrene (and oriented polystyrene)
Polyurethane elastomers
Polyvinyl chloride - plasticized
Polyvinyl chloride - unplasticized
Polyvinyl chloride copolymer resins
Polyvinylidene chloride and its copolymers
Polyvinyl acetate
Polyvinyl alcohol Adhesives which may be employed in the formation of the adhesive layer of the present invention include those which may be activated by pressure, heat or ultraviolet radiation or combinations thereof. These may include one or more of the following compositions:
(a) polymers, copolymers, terpolymers, etc., graft copolymers, block copolymers, etc., prepared from one of more of the following monomers:
Ethylene
Propylene
1-Butene
Isobutylene
1-Pentene
1-Hexene
1-Heptene
1-Octene
1-Decene
1-Dodecene
$\alpha$Olefins ($C_{11}$–$C_{18}$)
Butadiene
Isoprene
1,3-pentadiene
Chloroprene
2,3 Dichloro-1,3 Butadiene
Dipentene
Styrene
$\alpha$Methyl Styrene
t-Butyl Styrene
4 Methyl pentyl styrene
Divinyl benzene
Cyclopentene
Cyclohexene
Cycloheptene
Cyclooctene
CycloNonene
4-Methyl Cyclopentene 4-Ethyl Cyclopentene
4-Pentyl Cyclopentene
4-Hexyl Cyclodecene
Cyclopentadiene
1,3-Cyclohexadiene
1,3,5-Cyclooctatriene
1,3,5-Cyclododecatriene
3-allyl indene
β-piene
Δ³-Carene
Methyl acrylate
Ethyl acrylate
n-Butyl acrylate
Isobutyl acrylate
5-Butyl acrylate
2-Methyl butyl acrylate
Methyl pentyl acrylate
Methyl pentyl acrylate
n-Hexyl Acrylate
n-Heptyl Acrylate
2-Ethylhexyl acrylate
n-Octyl acrylate
n-Nonyl acrylate
n-Decyl acrylate
n-Undecyl acrylate
Lauryl acrylate
6-Methoxy acrylate
Hydroxyethyl acrylate
Hydroxypropyl acrylate
Methoxy butyl acrylate
Butanediol monoacrylate
Ethylene glycol monoacrylate
Diethylene glycol triacrylate
Trimethylolpropane triacrylate
Tetraethylene glycol diacrylate
Tetraethylene glycol di(chloroacrylate)
3-Chloro-2-hydroxypropyl acrylate
2-Cyanoethyl acrylate
Glycidyl acrylate
Methyl methacrylate
n-Butyl methacrylate
t-Butyl methacrylate
n-Hexyl methacrylate
2-Ethylhexyl methacrylate
n-Nonyl methacrylate
n-Decyl methacrylate
n-Dodecyl methacrylate
1-Chlorodecyl methacrylate
Hydroxypropyl methacrylate
Diethylene glycol dimethacrylate
Triethylene glycol dimethacrylate
Tetraethylene glycol dimethacrylate
Trimethylol propane trimethacrylate
Dipropylene glycol dimethacrylate
Di(pentamethylene glycol) dimethacrylate
Ethylene glycol dimethylmethacrylate
2-Cyanoethyl methacrylate
Dimethylamino ethyl methacrylate
Glycidyl methacrylate
Trimethoxysilylpropyl methacrylate
Acrylic acid
Methacrylic acid
Crotonic acid
Fumaric acid
Succinic Anhydride
Itaconic acid
Maleic Anhydride
Methylene Glutaric acid
n-t-$C_{12}$ Maleamic acid
Vinyl acetate
Vinyl chloride
Vinylidene chloride
Vinyl benzyl alcohol
Sodium vinyl sulfonate
Methyl vinyl ether
Ethyl vinyl ether
Isobutyl vinyl ether
Acrylonitrile
Methacrylonitrile
Methylene glutaro nitrile
β-Propiolactone
N-vinyl pyrrolidone
N-vinyl caprolactam
N-vinyl imidazole
Acrylamide
Methacrylamide
N-t-Butyl acrylamide
N-Octyl acrylamide
Diacetone acrylamide
N-Methylol acrylamide
N-n-Butoxymethyl methacrylamide
N-Methylol methacrylamide
Triemthylamine methacrylimide
Triethylamine methacrylimide
Tributylamine methacrylimide
3(2-acryloxyethyl dimethylammonium) propionate betaine
3(2-Methacryloxyethyl dimethylammonium) propionate betaine
3(2-Acryloxyethyl dimethylammonium) sulfonate betaine
1,1-Dimethyl-1(2-dryroxypropylamine)4-isopropenyl benzimide
Trimethylamine 4-isopropenyl benzimide
Trimethylamine 4-isopropenyl benzimide
Trimethyl amine 4-vinyl benzimide
N-(2-Aminoethyl) aziridine
N-(2-Cyanoethyl) aziridine
N-(2-Hydroxyethyl) aziridine
Acrolein
Diketene
Dibutyl fumarate
Ethyl acid maleate
Dioctyl maleate
Methyl hydrogen fumarate
Acrylic acid 2-isocyanate ester
Acrylol malonic acid diethyl ester
Phenyl allyl alcohol
α-Propane sulfone
Allyl glycidyl ether
3-Methacryloxypropyl tromethoxysilane
(b) Natural and synthetic polymers and elastomers such as:
Natural rubber
Gelatin
Cellulose acetate butyrate
Polyamides
Polyterpene resins
Extract acid polyepoxide resins
Silicone resins
Chlorinated rubber
Ethyl cellulose
Polyvinyl alcohol
Phenol-formaldeyde resins
Polyurethane resins
Isocyanate cross linked polyester resins Hydroxy terminated polysiloxanes (c) Polymers and elastomers listed above which have been subjected to various chemical modifications such as hydroxylation, carboxylation, thiolation, sulfonation and the like.

Optionally, these adhesive may be blended with a variety of additives to alter the physical properties of the composition. Examples of such additives include fillers such as fine silica and calcium carbonate to control tackiness, and plasticizers, such as dioctyl phthalate and castor oil, to lower melting points.

The adhesive composition may be applied to its base support by any convenient method known in the art, such as, spraying, brushing, rolling or meniscus coating the adhesive either in its existing state, by means of an appropriate solvent system or by heat melting into the molten state. Such solvent systems which may be employed herein, may include any organic solvent in an amount up to about 98% of the total application constituents. The balance of the solution may comprise from about 20% to about 100% by weight of a polymeric composition as hereinbefore mentioned, from about 0% to about 70% by weight of a plasticizer. Adhesion properties may be controlled by the selection of ingredients and the particular method of application selected.

The image forming layer may comprise a binding resin which includes thermoplastic and photopolymerizable resins. These may be composed of any of those polymers previously listed as available to form the adhesive layer, also those photopolymers enumerated in U.S. Pat. Nos. 2,760,863; 3,060,024, and 3,060,025 and in the publication, *Light Sensitive Systems* by Jaromir Kosar, John Wiley and Sons, New York, 1965. Optionally this imaging layer may contain any coloring agent which includes all those listed in the Color Index or metallic particles such as, iron oxide, aluminum powder of bronze powder which may be vapor or vacuum deposited, to also provide magnetic or conductive properties to the layer. The image layer may also optionally contain other additives such as a dispersant, for example, cobalt naphthenate or iron naphthenate. These ingredients may optionally be mixed in a solvent system wherein the solvent constituents comprise up to 98% of the total composition. The non solvent constituents may be present in the following percentages by weight: binding resin from about 0% to 100%, colorant or metallic particles from 0% to about 90% and dispersant from 0% to about 20%.

When the imaging and adhesive functions are incorporated into a single layer, the stratum consists of a selection of the imaging ingredients which also demonstrate the requisite adhesive properties.

As hereinbefore mentioned, either the image forming layer or the adhesive layer or both comprise light sensitive materials which harden, crosslink or polymerize upon exposure to ultraviolet radiation. When such layer is light sensitive it may comprise, based on weight of solids, I. From about 25% to 100% light sensitive composition comprising: (i) up to 10% photoinitiator; (ii) at least 90% material capable of hardening, crosslinking or polymerizing upon being blended with said photoinitiator and exposure to ultraviolet radiation; and II. Up to 75% of the binders, resins, fillers and colorants previously enumerated as being includable in said imaging or adhesive layers.

Non-limiting examples of such photoinitiators, photopolymers, photohardeners and photocrosslinkers are enumerated in U.S. Pat. Nos. 2,760,863; 3,060,024, and 3,060,024 and *Light Sensitive Systems*, ibid. Such light sensitive materials are not points of novelty herein.

The diazo layer may include any diazo composition which is capable of generating a substantial quantity of nitrogen gas upon exposure to an ultraviolet energy source. These include such photosensitive compositions as the diazo and azide substances which may include the reaction product of paradiazo diphenyl amine-para-formaldehyde condensate and 2-hydroxy-4-methoxy benzophenone sulfonic acid;

P-N,N-dimethylaminobenzenediazonium zinc chloride

P-N,N-diethylaminobenzenediazonium zinc chloride

4(p-tolyl-mercapto)-2,5-dimethoxybenzene diazonium zinc chloride

4(p-tolyl-mercapto)-2,5-diethoxybenzene diazonium zinc chloride 4-morpholino-2,5-dibutoxybenzenediazonium zinc chloride 4-morpholino-2,5-dibotoxybenzenediazonium fluoborate P-N-ethyl-N-benzylaminobenzene diazonium zinc chloride 4-diazo-diphenylamine sulfate 1-diazo-4-N,N-dimethylamino-benzene zinc chloride 1-diaxzo-4-N,N-diethylamino-benzene zinc chloride 1-diazo-4-N-ethyl-N-hydroxyethylamino-benzene ½ zinc chloride 1-diazo-4-N-Methyl-N-hydroxyethylamino-benzene ½ zinc chloride 1-diazo-2,5-diethoxy-4-benzoylamino-benzene, ½ zinc chloride 1-diazo-4-N- benzylamino-benzene, ½ zinc chloride 1-diazo-4-N,N-dimethylamino-benzene borofluoride 1-diazo-4-morpholino-benzene, ½ zinc chloride 1-diazo-4-morpholino-benzene-borofluoride 1-diazo-2,5-dimethoxy-4-p-tolylmercaptobenzene, ½ zinc chloride 1-diazo-2-ethoxy-4-N,N-dimethylaminobenzene, ½ zinc chloride p-diazo-dimethyl aniline, ½ zinc chloride 1-diazo-4-N,N-diethylamino-benzene, ½ zinc chloride 1-diazo-2,5-dibutoxy-4-morpholino-benzene sulfate 1-diazo-2,5-diethoxy-4-morpholino-benzene, ½ zinc chloride 1-diazo-2,5-dimethoxy-4-morpholino-benzene, zinc chloride 1-diazo-2,5-diethoxy-4-morpholino-benzene, ½ zinc chloride 1-diazo-2,5-diethoxy-4-morpholino-benzene- borofluoride 2-diazo-1-naphthol-5-sulfonic acid, sodium salt 1-diazo-4-N,N-diethylamino-benzene, borofluoride 1-diazo-2,5-diethoxy-4-p-tolylmercapto-benzene, ½ zinc chloride 1-diazo-3-ethoxy-4-N-methyl-N-benzylamino-benzene, ½ zinc chloride 1-diazo-3-chloro-4-N,N-diethylamino-benzene, ½ zinc chloride 1-diazo-3-methyl-4-pyrrolidino-benzene chloride, zinc chloride 1-diazo-3-methyl-4-pyrrolidino-benzene-borofluoride 1-diazo-2-chloro-4-N,N-dimethylamino-5-methoxy-benzene, borofluoride 1-diazo-3-methoxy-4-pyrrolidino benzene, zinc chloride condensation product of 4-diazo-diphenylamine sulfate and formaldehyde zinc chloride
p-azide cinnamic acid
2,6-di(4'-azidebenzal)-4-methylcyclohexanone
3-azide phthalic anhydride
4,4'-diazide-3,3'-dimethyl-biphenyl
4,4'-diazide-3,3'-dichloro-biphenyl
4,4'-diazidebenzol acetylacetone
4,4'-diazide-3,3'-dimethoxyl-biphenyl
4,4'-diazide diphenylmethane
4,4'-diazide diphenyl sulfone
2,6-di-(4'-azidebenzal)-cyclohexanone
4,4'-diazidebenzalacetone-2,2'-disulfic acid sodium salt
4,4'-diazide stylbene-2,2'disulfic acid sodium salt
azidopyrenes, such as, 1-azido-pyrene, 6-nitro-1-azido-pyrene, 1,6-diazidopyrene, 1,8-diazido-pyrene, 1-propionyl-6-azidopyrene, 1-acetyl-6-azidopyrene, 1-n-butyryl-6-azidopyrene, 1-n-propionyl-8-bromo-6-azidopyrene; and 8-n-propionyl-1,6-diazidopyrne; and the aromatic diazo-oxide compounds, for example, benzoquinone diazides, naphthoquinone diazides. Also included are those gas generating photosensitive compositions listed in *Light Sensitive Systems*, ibid.

These diazo substances may be combined with a binder resin such as those listed as appropriate for use in conjunction with the adhesive layer. Optionally, additives may be incorporated into this layer such as fillers, for example, fine silica to modify delamination speed, ultraviolet absorbers, such as, G.A.F. Uvinul M40, to control exposure speed, and colorants such as Rose Bengal, Rhodamin B and methylene blue, as set forth in the Color Index.

These ingredients may be blended with a solvent system which comprises up to about 98% of the total composition. The non solvent ingredients may be present in the following percentages by weight: energy sensitive composition from about 50% to 100%; binder resin up to 50%, fillers up to 10%, ultraviolet absorbers up to 5% and colorants up to 5%.

The top covering layer may comprise any flexible, transparent material mentioned hereinbefore as suitable for use as the bottom layer. It must be substantially gas impermeable and should be as thin as practicable so as not to detrimentally affect image resolution.

Typically the base layer has a thickness in excess of from about 0.25 mil; the adhesive layer has a coating weight of from about 10 mg/sq. ft. to about 10 g/sq. ft; the image layer has a coating weight of from about 10 mg/sq. ft. to about 50 g/sq. ft.; the diazo layer has a coating weight of from about 1 mg/sq. ft. to about 10 g/sq. ft. and the top layer has a thickness of from about 0.25 to about 4 mils.

The construction may be erected by any convenient means such as applicator coating of fluid state composition with subsequent drying or pressure lamination of solids.

Characteristically, the exposure mask is held in intimate contact with the upper surface of the top layer by means of a vacuum frame as is well known in the art. Exposure energy may then be supplied by the introduction of ultraviolet, actinic, or xenon flash irradiation for from about 1/1000 second to about 10 minutes. It is also within the contemplation of the instant invention that energy may also selectively be applied from a laser energy source.

After the construction has been imagewise exposed and peeled apart, the positive reproduction, which appears on the top support partially in the form of unexposed energy sensitive material, may be subjected to another exposure, non-imagewise. This stabilizes the previously unexposed positive image and, since this material also generates gas upon exposure, effectively loosens the positive image from the top support for a subsequent transfer of said image to another surface.

As an alternative exposure method, irradiation may be applied through the bottom rather than the top layer if said bottom layer is transparent. However, it has been found that the resolution of the article is superior if radiation reaches the energy sensitive layer through only the top layer rather than the multiple lower layers.

The optimum combination of ingredients, proportions and application conditions may be selected by the skilled worker depending upon the specific results sought to be achieved.

The following specific examples illustrate the invention but it is to be understood that variations and modifications can be made therein without departing from the spirit and scope of the invention.

EXAMPLE 1

A photosensitive composition comprising a combination of:
5 g Epoxy Resin (available as "Epon" from Shell Chemical Company)
15 g p-diazo dimethylaniline ½ $ZnCl_2$
80 ml Ethylene dichloride
25 ml Methanol
25 ml Methyl cellosolve
25 ml Dimethyl formamide was coated on a 1 mil transparent polyester film. Applied to said photosensitive layer was an image layer comprising of a combination of:
20 g Versamide 754 (available from General Mills)
5 g Carbon black
40 ml Toluene
40 ml Isopropyl alcohol
5 g Iron naphthanate On a second film of 3 mil mylar was applied an adhesive composition which comprised 5 g DV 530 (photopolymerizable oligomer from Polychrome), 5 g silicon resin (GE Siligrip SR-573), 0.25 g Michler's ketone and 0.25 g benzophenone.

These two coated films were then laminated together forming an image layer-adhesive layer interface to form the basic construction of FIG. 1.

The construction was exposed to actinic light from a carbon arc source through an original transparency for 30 seconds from the side of the 3 mil polyester film. When this laminated sheet was delaminated after light exposure, a negative image was obtained on the 3 mil polyester film and a positive image was obtained on the sheet of 1 mil polyester film.

EXAMPLE 2

A construction was produced according to example 1 except the imaging layer comprised:

| | |
|---|---|
| Versamide 754 (available from General Mills) | 45 g |
| 2,6-di(4'-azidobenzal)-4-methylcyclohexanone | 1 g |
| Toluene | 135 ml |
| Isopropyl alcohol | 81 ml |
| Cyclohexanol | 30 ml |
| Rhodamine B-MS40 | 1.5 g | where MS40 is ultraviolet absorber available from G.A.F. Corporation.

Vivid red images were obtained by laminating the adhesive layer described in example 1, exposing and peeling. This image was useful for overhead projection and for an overlay color proof by overlapping on the other color images.

EXAMPLE 3

Example 2 was repeated with:
20 g pentaerythritol triacrylate
0.5 g Michler's ketone
0.5 g Benzophenone
in place of azido crosslinking initiator. Vivid red images were obtained by exposure and peeling.

EXAMPLE 4

The formulations below were coated successively on a 2 ml polyester sheet:
(a) A photosensitive layer comprising a combination of:

| Epon Resin (Shell Chemical) | 5 g |
| p-diazo-dimethylaniline ½ZnCl$_2$ | 15 g |
| Ethylene dichloride | 80 ml |
| Methanol | 25 ml |
| Methyl cellosolve | 25 ml |
| Dimethyl formamide | 25 ml |

(b) An image layer comprising a combination of:

| Versamide 754 | 20 g |
| Phthalocyanine blue pigment | 1 g |
| Toluene | 135 ml |
| Isopropyl alcohol | 81 ml |
| Cyclohexanol | 40 ml |
| DV 53 (Polychrome Corporation) | 4 g |
| Michler's ketone | 0.1 g |
| Benzophenone | 0.1 g |

At the same time 10 g of silicone adhesive (General Electric Siligrip SR-573) diluted with 5 g of toluene was coated on a 3 ml polyester film support sheet. This coated support sheet was laminated with the cover sheet to form the basic construction of FIG. 1. Actinic light from carbon arc was imagewisely exposed through transparent original for 30 seconds from the cover sheet side. After peeling, the support sheet showed a strong blue image.

EXAMPLE 5

The following photosensitive layer composition was coated onto a 3 mil polyester film and overcoated with the image layer of Example 4:

| Epon Resin 1031 (commercially available from Shell Chemical Co.) | 5 g |
| 2,6-di(4'-azide benzol)-4-methyl cyclohexanone | 5 g |
| N—hydrothioacridone | 0.2 g |
| Ethylene dichloride | 80 ml |
| Methanol | 10 ml |
| Methyl cellosolve | 10 ml |
| Dimethyl formamide | 20 ml |

A strip of tuck tape #21 was then laminated on the above layer. Negative and positive images were obtained by peeling apart the film and the tape after a 20 second exposure from a carbon arc lamp.

EXAMPLE 6

The energy sensitive layer and image layer of Example 4 were coated on a 1 mil polyester film and further overcoated with an adhesive layer composition consisting of 5 g of acrylic adhesive (Franklyn Chem., Covinax 117), dissolved in 0.5 g of surfactant (Mona, "Cyna" 50% in water). A 0.5 mil polyester film was then laminated as cover sheet. Actinic light was imagewisely exposed for 30 seconds through the 3 mil mylar. When the laminated sheets were peeled apart, a positive image was obtained on the cover sheet and negative image was obtained on the 3 mil mylar.

EXAMPLE 7

Example 6 was repeated using bond paper in place of the 0.5 mil polyester. By delamination after a 30 second exposure to actinic light through the 3 mil polyester, a positive image was obtained on the paper and a negative image was obtained on the 3 mil mylar. A glue was coated on the backside of paper with the image to be used as paper label.

EXAMPLE 8

The following formulations were successively coated on a 1 mil polyester film:
Firstly a sensitizer layer comprising a combination of:

| Epon 1031 (Shell Chemical Co.) | 5 g |
| p-diazo dimethylaniline ½ZnCl$_2$ | 15 g |
| Ethylene dichloride | 80 ml |
| Methanol | 25 ml |
| Methyl cellosolve | 25 ml |
| Dimethyl formamide | 25 ml |

Secondly an adhesive imaging layer comprising a combination of:

| DV 53 (Polychrome Corp.) | 10 g |
| Epocryl resin | 10 g |
| Michler's ketone | 0.1 g |
| Irgacure (Ciba-Geigy) | 0.1 g |
| Carbon black | 5 g |
| Toluene | 40 ml |
| Isopropyl alcohol | 40 ml |
| Iron maphthanate | 5 g |

This film was laminated on a copperclad circuit board. This was exposed to actinic light from a carbon arc lamp through a transparent original for 30 seconds from the side of the 1 mil polyester film. When this sheet was delaminated after light exposure, a negative image was obtained on the circuit board, and positive image was obtained on the base sheet of 1 mil polyester film. The negative image on the board showed good etch resistance against copper etchants used for circuit board preparation.

EXAMPLE 9

The procedure of example 8 was followed except the imaging layer comprised:

| DV 53 (Polychrome Corp.) | 25 g |
| Halowax (Koppers) | 20 g |
| Toluene | 135 ml |
| Isopropyl alcohol | 81 ml |
| Rhodamine B-MS 40 | 1.5 g |

-continued

| | |
|---|---|
| Michler's ketone | 0.2 g |
| Benzoin methyl ether | 0.1 g | and a copper circuit board was laminated to the adhesive layer.

Actinic light was exposed for 45 seconds through a transparent negative original from the side of 3 mil polyester. When the 3 mil polyester film was delaminated after light exposure, vivid red positive images were obtained on the circuit board. Copper on the unimaged area was etched by immersing the plate in a copper etching solution. After copper etching, a positive print circuit was obtained by taking off the red image with a mixture of methanol and ethylene dichloride.

EXAMPLE 10

A light sensitive composition comprising:

| | |
|---|---|
| Epon 1031 (Shell Chemical Co.) | 5 g |
| 2,6-di(4'-diazide benzol)-4-methyl-cyclohexanone | 5 g |
| N—hydrothioacridone | 0.2 g |
| Ethylene dichloride | 80 ml |
| Methanol | 10 ml |
| Methyl cellosolve | 10 ml |
| Dimethyl formamide | 20 ml | was coated on a 2 mil polyester film and overcoated first with the image layer of Example 4 and an adhesive layer comprising:

| | |
|---|---|
| Silicone adhesive Siligrip SR-529 | 20 g |
| DV 53 (Polychrome Corp.) | 4 g |
| Toluene | 80 ml |
| Benzophenone | 0.1 g |
| Michler's ketone | 0.1 g |

A silk screen was then laminated on the glue surface of above sheet. Actinic light was exposed for 35 seconds through the positive transparent original from the side of the 3 mil polyester film. When the 3 mil polyester film was peeled apart after exposure, vivid red negative images were obtained on the silk screen. Silk screen printing was demonstrated by using this screen. A clear positive ink image was obtained on paper by going through the inked non-image area.

It is, of course, to be understood that the foregoing disclosure is intended to illustrate the invention and that numerous changes can be made in the conditions and proportions set forth without departing from the scope of the invention, as disclosed and defined in the claims appended hereafter.

We claim:

1. A multi-layered sheet construction capable of reproducing both positive and negative forms of a photographic transparency image which comprises successive adherent layers comprised of:
   (a) A flexible, transparent, substantially gas impermeable top support capable of transmitting radiant energy therethrough and having adhered to one surface thereof;
   (b) A first photosensitive composition layer which comprises (i) a major amount of a light-sensitive, substantially gas generating diazonium substance and may contain (ii) minor amounts of resinous materials, such that said photosensitive composition disintegrates with a concurrent forced expulsion of gas upon exposure to an ultraviolet energy supply to which it is reactive, said photosensitive layer having adhered thereto;
   (c) An image forming layer comprising a resinous material which is capable of being imagewise separated upon the application of dissociative shearing forces, said image forming layer comprising, based on weight of solids:
   I. From about 25% to 100% light sensitive composition comprising (i) up to 10% photoinitiator, (ii) at least 90% material capable of hardening, crosslinking or polymerizing upon being blended with said photoinitiator and being exposed to ultraviolet radiation; and
   II. Up to 75% of materials selected from the group consisting of binding resins, fillers and colorants, said image forming layer having adhered thereto;
   (d) A bottom support having a substantially regular surface, whereby, upon exposure of the multi-layered sheet construction to an ultraviolet radiant energy source through a photographic transparency from the direction of the top transparent support, said energy causes said first photosensitive composition to spontaneously, outwardly expel a gas so as to exert outward forces on said top support and said image layer at the exposed locations, thereby forming an imagewise bubble system which is visible through said top support, said radiant energy is transmitted through said first photosensitive composition layer and reaches and reacts with said image forming composition layer, causing the light sensitive composition in said image forming layer to harden at the thusly exposed locations such that upon a subsequent separation of said bottom and said top supports, solely by means of peeling forces, an imagewise shearing of the image layer is effected along interfaces which are in underlying registration with an interface formed between the exposed and unexposed portions of the first photosensitive layer; and a negative reproduction of the transparency image is thereby produced comprising said bottom support, and the negatively imagewise separated image forming layer attached to the bottom support, and a positive reproduction of the transparency image is simultaneously produced in the form of said top support, the unexposed first photosensitive composition layer attached to said top support, and the positively imagewise separated image forming layer material attached to and in registration with said unexposed first photosensitive layer.

2. The construction of claim 1 further comprising an adhesive layer, adherently disposed between said image forming layer and said bottom support said adhesive layer demonstrating a greater adhesive attraction to said bottom support than to said image forming layer, such that said adhesive layer is not imagewise separable and said negative reproduction comprises said bottom support, said adhesive layer attached to said bottom support and said negatively imagewise separated image forming layer attached to said adhesive layer.

3. The multi-layered sheet construction of claim 1 further comprising an adhesive layer disposed between said image forming layer and said bottom support such that said adhesive layer is imagewise sheared upon a separation of said bottom and top supports whereby the positive imagewise sheared portion of the adhesive layer adheres in registration with the positive imagewise sheared portion of said image layer, and the negative imagewise sheared portion of the adhesive layer is in adherent disposition between the negative imagewise sheared portion of said image layer and said bottom support.

4. The construction of claim 3 wherein said adhesive layer comprises, based on weight of solids:
  I. From about 25% to 100% light sensitive composition comprising (i) up to 10% photoinitiator; (ii) at least 90% material capable of hardening, crosslinking or polymerizing upon being blended with said photoinitiator and being exposed to ultraviolet radiation; and
  II. Up to 75% of materials selected from the group consisting of binding resins and fillers.

5. A multi-layered sheet construction capable of reproducing both positive and negative forms of a photographic transparency image which comprises successive adherent layers comprising:
  (a) A flexible, transparent, substantially gas impermeable top support capable of transmitting radiant energy therethrough and having adhered to one surface thereof;
  (b) A first photosensitive composition layer which comprises (i) a major amount of a light-sensitive, substantially gas generating diazonium substance and may contain (ii) minor amounts of resinous materials, such that said photosensitive composition disintegrates with a concurrent forced expulsion of gas upon exposure to an ultraviolet energy supply to which it is reactive, said photosensitive layer having adhered thereto;
  (c) An image forming layer comprising a resinous material which is capable of being imagewise separated upon the application of dissociative shearing forces, said image forming layer having adhered thereto;
  (d) An adhesive layer comprising a resinous material capable of being imagewise separated upon the application of dissociative shearing forces, said adhesive layer comprising:
  I. From about 25% to 100% light sensitive composition comprising (i) up to 10% photoinitiator; (ii) at least 90% material capable of hardening, crosslinking or polymerizing upon being blended with said photoinitiator and exposure to ultraviolet radiation; and
  II. Up to 75% of a material selected from the group consisting of binding resins and fillers; said adhesive layer having adhered thereto;
  (e) A bottom support having a substantially regular surface, whereby upon exposure of the multi-layered sheet construction to an ultraviolet radiant energy source through a photographic transparency from the direction of the top transparent support, said energy causes said first photosensitive composition to spontaneously, outwardly expel a gas so as to exert outward forces on said top support and said image layer at the exposed locations, thereby forming an imagewise bubble system which is visible through said top support, said radiant energy is transmitted through said image forming layer and reaches and reacts with said adhesive layer, causing the adhesive layer light-sensitive composition to harden at the thusly exposed locations, such that upon a subsequent separation of said bottom and said top supports, solely by means of peeling forces, an imagewise shearing of the image layer and the adhesive layer is effected along their respective interfaces which are in underlying registration, with an interface formed between the exposed and unexposed portions of the first photosensitive layer; and a negative reproduction of the transparency image is thereby produced in the form of said bottom support, the exposed negatively imagewise separated adhesive layer attached to said bottom support, and the negatively imagewise separated image forming layer attached in registration with said negatively imagewise separated exposed adhesive layer, and a positive reproduction of the transparency image is simultaneously produced in the form of said top support, the unexposed first photosensitive composition layer attached to said top surface, the positively imagewise separated image forming layer material attached to and in registration with said unexposed first photosensitive layer, and the unexposed positively imagewise separated adhesive layer attached in registration with the positively imagewise separated image forming layer.

6. The construction of claims 1, 2, 3, 4 or 5 wherein the first photosensitive composition comprises p-diazo dimethylaniline ½ zinc chloride.

* * * * *